(12) United States Patent
Yoshida

(10) Patent No.: US 7,555,026 B2
(45) Date of Patent: Jun. 30, 2009

(54) SEMICONDUCTOR LASER DEVICE

(75) Inventor: Yasuaki Yoshida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/934,174

(22) Filed: Nov. 2, 2007

(65) Prior Publication Data

US 2008/0219314 A1    Sep. 11, 2008

(30) Foreign Application Priority Data

Mar. 8, 2007   (JP) .............................. 2007-058227

(51) Int. Cl.
*H01S 5/00* (2006.01)
(52) U.S. Cl. ............................. 372/49.01; 372/46.013
(58) Field of Classification Search ............ 372/46.013, 372/49.01, 50.1
See application file for complete search history.

(56) References Cited

U.S. PATENT DOCUMENTS 1,953,998 A * 4/1934 Truesdale et al. ............ 205/333

7,106,775 B2   9/2006  Matsuoka et al.
2006/0133442 A1* 6/2006  Kondou et al. ........... 372/49.01

FOREIGN PATENT DOCUMENTS

| JP | 3-76184 | 4/1991 |
|----|---------|--------|
| JP | 3-145175 | 6/1991 |
| JP | 6-275913 | 9/1994 |
| JP | 9-116221 | 5/1997 |
| JP | 2002-100830 | 4/2002 |
| JP | 2004-296903 | 10/2004 |
| JP | 2006-147814 | 6/2006 |

* cited by examiner

*Primary Examiner*—Armando Rodriguez
(74) *Attorney, Agent, or Firm*—Leydig, Voit & Mayer, Ltd.

(57) ABSTRACT

A semiconductor laser device includes a cavity extending in a propagation direction of a laser beam (X-direction). A front facet is on one end of the cavity through which the laser beam is emitted. A rear facet is on the other end of the cavity. An anodic oxide film is provided on at least one of the front facet and the rear facet, and the anodic oxide film preferably has a thickness of $\lambda/4n$ or an odd integer multiple thereof, where $\lambda$ is the wavelength of the laser beam and n is the refractive index of the anodic oxide film.

12 Claims, 4 Drawing Sheets

SEMICONDUCTOR LASER DEVICE

FIELD OF THE INVENTION

The present invention relates to a semiconductor laser device for use in optical disc system or optical communication, and more particularly to a blue semiconductor laser device formed of gallium nitride semiconductor material.

BACKGROUND ART

Semiconductor laser devices have been widely used in optical disc systems and optical communications (see, e.g., Japanese patent publication No. JP-3080312, JP-A-2002-100830 and JP-A-2004-296903). These semiconductor laser devices include a cavity to generate a laser beam. The cavity has a front facet formed on one end thereof to emit the laser beam and has a rear facet formed on the other end. An insulating film, or coating film, is formed on each facet to reduce the operating current of the semiconductor laser, to prevent return of light, and to increase the output power.

Generally, in high power semiconductor lasers, a low reflectance coating film is formed on the front facet, and a high reflectance coating film is formed on the rear facet. Specifically, the reflectance of the coating film on the rear facet is typically 60% or higher, preferably 80% or higher. The reflectance of the coating film on the front facet, on the other hand, is determined based on the required characteristics of the semiconductor laser. (Lower reflectance does not necessarily guarantee higher laser performance.) For example, semiconductor lasers for exciting a fiber amplifier used in combination with a fiber grating employ a coating film having a reflectance of approximately 0.01-3%. General high power semiconductor lasers, on the other hand, employ a coating film having a reflectance of approximately 3-7%, or a coating film having a reflectance of approximately 7-20% when it is necessary to prevent return of light.

The coating films protect the facets, that is, they function as passivation films for the semiconductor interfaces (see, e.g., Japanese patent publication No. JP-A-2004-296903 noted above). However, coating films of conventional material have a problem in that an interface state occurs at their interface with the underlying semiconductor, resulting in a reduced COD (Catastrophic Optical Damage) threshold.

To prevent such COD threshold reduction, a GaAs semiconductor laser may have a window structure formed by disordering the active layer, which has been proven to be effective and has been practically implemented (see, e.g., Japanese patent publication No. JP-A-2006-147814). Further, efforts are being made to form such a window structure in a nitride semiconductor laser.

For reference, the followings are prior art Japanese patent publications.

JP-3080312,
JP-A-2002-100830,
JP-A-2004-296903,
JP-A-2004-296903,
JP-A-2006-147814

However, blue semiconductor lasers also have another problem with regard to the coating films. Since the wavelength of the laser beam of these semiconductor lasers is short, the coating films have a high optical absorption coefficient and hence tend to degrade, as compared to conventional semiconductor lasers. Further, since conventional coating films do not adequately function as passivation films, the crystalline structure of the facet portions of the laser may be degraded, resulting in a reduced COD threshold.

The present invention has been devised to solve the above problems. It is, therefore, an object of the present invention to provide an extended life semiconductor laser device in which a protective film is formed on one or both of the facets of the cavity.

Other objects and advantages of the present invention will become apparent from the following description.

SUMMARY OF THE INVENTION

According to one aspect of the present invention, a gallium nitride semiconductor laser device, in which semiconductor films are formed on a substrate, comprises a cavity formed to extend in a propagation direction of a laser beam. A first facet is formed on one end of the cavity to emit the laser beam. A second facet is formed on the other end of the cavity. Anodic oxide film is provided on at least one of the first and second facets, and the anodic oxide film is formed by anodizing the at least one of the first and second facets.

According to another aspect of the present invention, a gallium nitride semiconductor laser device, in which semiconductor films are formed on a substrate, comprises a cavity formed to extend in a propagation direction of a laser beam. A first facet is formed on one end of the cavity to emit the laser beam. A second facet is formed on the other end of the cavity. Anodic oxide film is provided on at least one of the first and second facets, and the anodic oxide film is formed by anodizing the at least one of the first and second facets. Further, a single-layer or multilayer coating film is formed on the anodic oxide film.

Thus, the present invention provides extended life for semiconductor laser devices in which a protective film is formed on one or both of the facets of the cavity.

DETAILED DESCRIPTION OF THE PREFERRED EMBODIMENTS

Preferred embodiments of the present invention will now be described with reference to the accompanying drawings. It should be noted that in the following figures, like numerals will be used to denote like or corresponding components to avoid undue repetition.

First Embodiment

Figure 1:
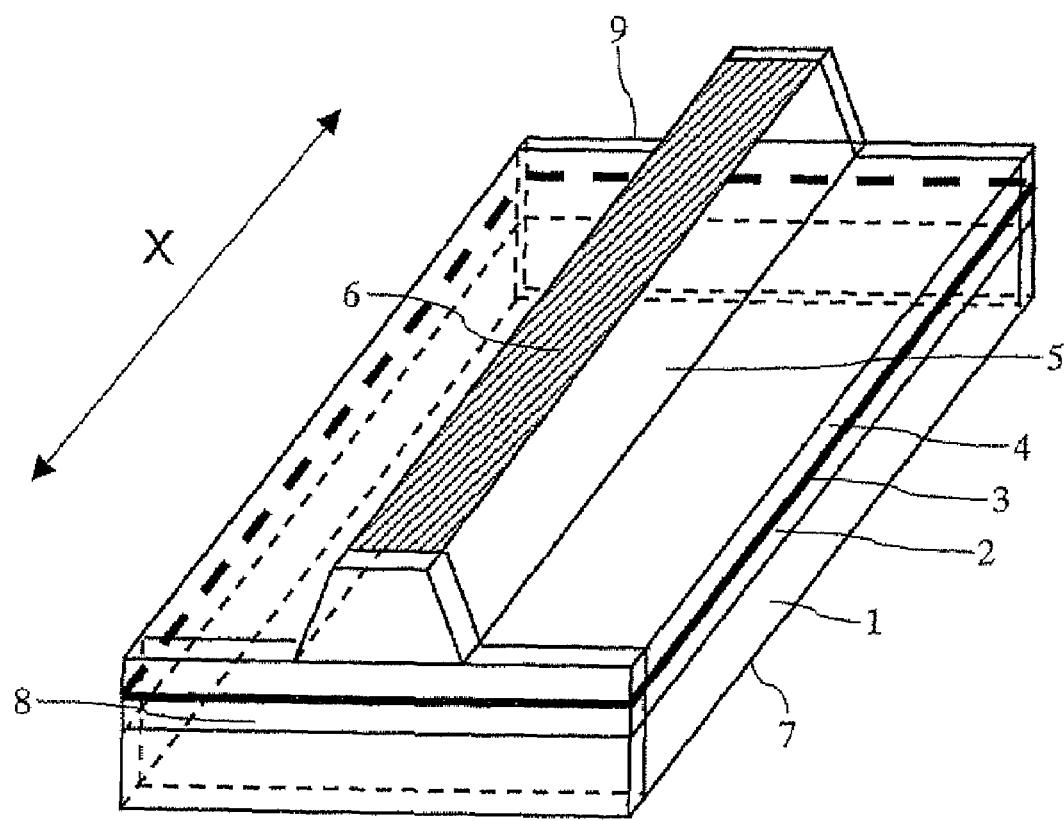
FIG. 1 is a perspective view of a semiconductor laser device according to a first embodiment of the present invention.

FIG. 1 is a perspective view of a semiconductor laser device according to a first embodiment of the present invention. This semiconductor laser device is a gallium nitride semiconductor laser device that emits a blue laser beam and employs a GaN substrate 1.

Referring to FIG. 1, an n-type cladding layer 2, an active layer 3, and a p-type cladding layer 4 are sequentially formed on top of the GaN substrate 1. The p-type cladding layer 4 has portions thereof removed by etching to form a ridge 5. A p-electrode 6 is provided on top of the ridge 5, and an n-electrode 7 is provided on the bottom surface of the GaN substrate 1. A specular surface is provided on each facet of the ridge, and a cavity is formed to extend in the X-direction (as shown in FIG. 1). The front facet 8 of the cavity, which emits a laser beam, is referred to as a "first facet" in the appended claims. The rear facet 9 of the cavity, opposing the front facet 8, is referred to as a "second facet" in the appended claims. The front facet 8 has a low reflectance, while the rear facet 9 has a high reflectance.

Figure 2A:
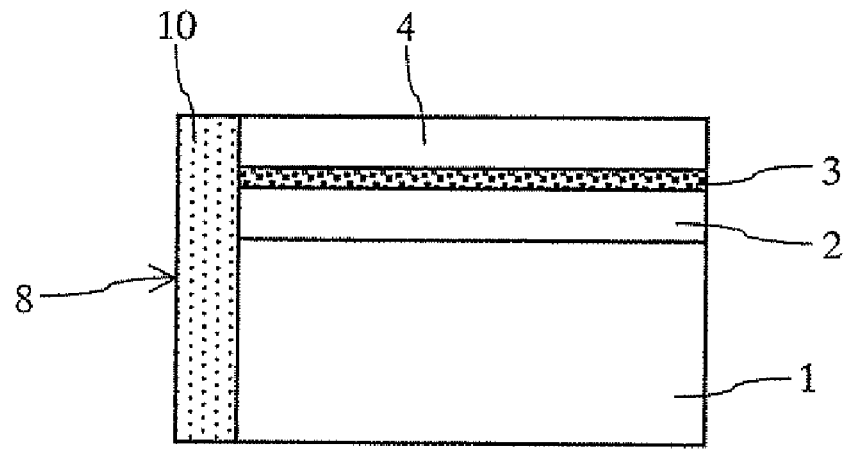
FIG. 2A is an enlarged cross-sectional view of the front end portion of the semiconductor laser device of FIG. 1.

FIG. 2A is a cross-sectional view of the front end portion of the laser device of FIG. 1 extending from the front facet 8. As shown in FIG. 2A, an anodic oxide film 10 is formed on the front facet 8 to a thickness of $\lambda/4n$ (where $\lambda$ is the wavelength of the laser beam and n is the refractive index of the dielectric film, or the anodic oxide film) by anodizing the nitride semiconductor. Anodizing gallium nitride generally produces a substance similar to gallium oxide, which has a bandgap of approximately 4 eV and a refractive index of approximately 2. Therefore, if the oscillation wavelength of the laser is assumed to be 400 nm, the thickness of the anodic oxide film 10 is approximately 50 nm. Since the anodic oxide film 10 is a low reflecting film, the laser has high slope efficiency.

Figure 2B:
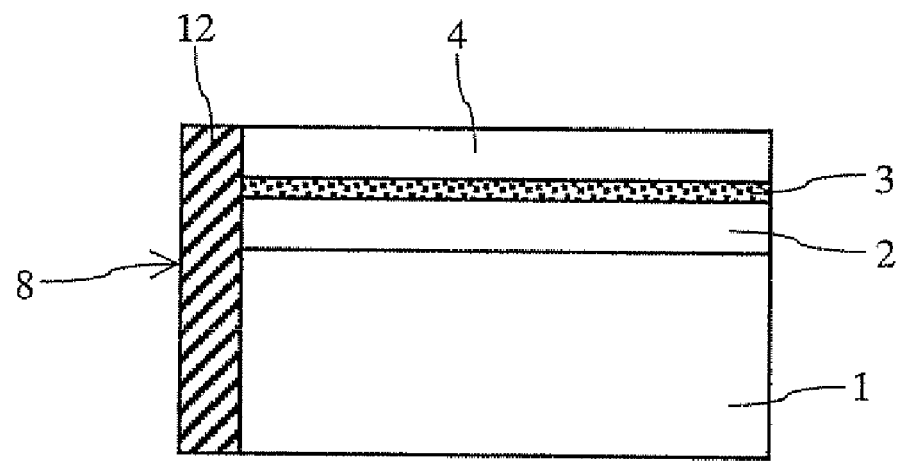
FIG. 2B is a cross-sectional view, for comparison, of the front end portion of another semiconductor laser device.

FIG. 2B shows for comparison a cross-sectional view of the front end portion of another laser device. The front facet 8 of this Laser device has a conventional coating film 12 formed thereon. The coating film 12 is a vapor-deposited film of alumina (having a refractive index of 1.7) and has a thickness of $\lambda/4n$ (=59 nm) and also functions as a low reflecting film. It should be noted that this laser device is similar to that shown in FIG. 2A except that it includes the coating film 12 instead of the anodic oxide film 10.

In the structure shown in FIG. 2A, the anodic oxide film 10 functions to reduce the interface state density, as described in Japanese patent publication No. JP-A-1991-76184. Further, the anodic oxide film 10 is formed of a semiconductor (or insulator) having a large bandgap and is transparent to 400 nm wavelength laser light. These features of the anodic oxide film 10 allow it to function in the same way as a window formed in the facet portion as described above, thereby preventing a reduction in the COD (Catastrophic Optical Damage) threshold.

Further in the example shown in FIG. 2A, since the anodic oxide film 10 has a thickness of $\lambda/4n$, it functions as a low reflecting coating film, eliminating the need to form another coating film on the anodic oxide film 10. It should be noted that the anodic oxide film 10 may have a thickness of an odd multiple of $\lambda/4n$, with the same effect.

Since the anodic oxide film 10 is formed by oxidizing the nitride semiconductor, the interface between the film and the nitride semiconductor is unlikely to suffer high stress, as compared to the case where a common coating film 12 is formed on the facet. Therefore, the anodic oxide film 10 can reduce the interface state density even if it has an increased thickness. The anodic oxidation method has the advantage that it can form a thick oxide film (having a thickness of a few hundreds of nanometers) at low temperature while accurately controlling the thickness, as will be described in connection with a fifth embodiment of the present invention. Therefore, on the anodic oxide film 10, a conventional coating film need not to be formed by a material different from nitride semiconductor. Thus, the above anodizing process can form a low reflecting film having a thickness of $\lambda/4n$.

Second Embodiment

Figure 3:
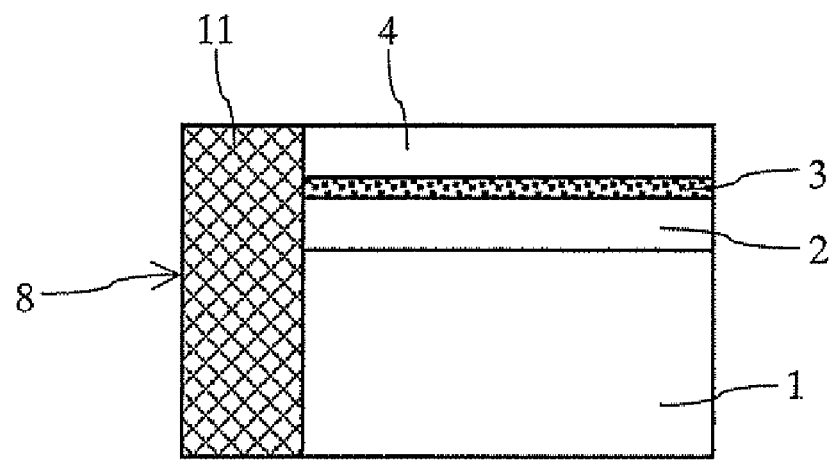
FIG. 3 is an enlarged cross-sectional view of the front end portion of the semiconductor laser device according to a second embodiment of the present invention.

In the first embodiment, the anodic oxide film 10 having a thickness of $\lambda/4n$ is formed on the front facet 8, whereas in a second embodiment of the present invention, an anodic oxide film 11 having a thickness $\lambda/2n$ (where $\lambda$ is the wavelength of the laser beam and n is the refractive index of the dielectric film, or the anodic oxide film) is formed on the front facet 8, as shown in FIG. 3.

In the structure shown in FIG. 3, too, the anodic oxide film functions in the same way as a window formed in the facet portion as described above, thereby preventing a reduction in the COD threshold. Further, since the anodic oxide film has a thickness of $\lambda/2n$, the facet has substantially the same reflectance (approximately 18%) as that when no thin film is formed on it, effectively preventing return of light.

Third Embodiment

A semiconductor laser device of a third embodiment of the present invention has a configuration similar to that of the semiconductor laser device of the first embodiment except that the front end portion extending from the front facet 8 has a different structure.

Figure 4:
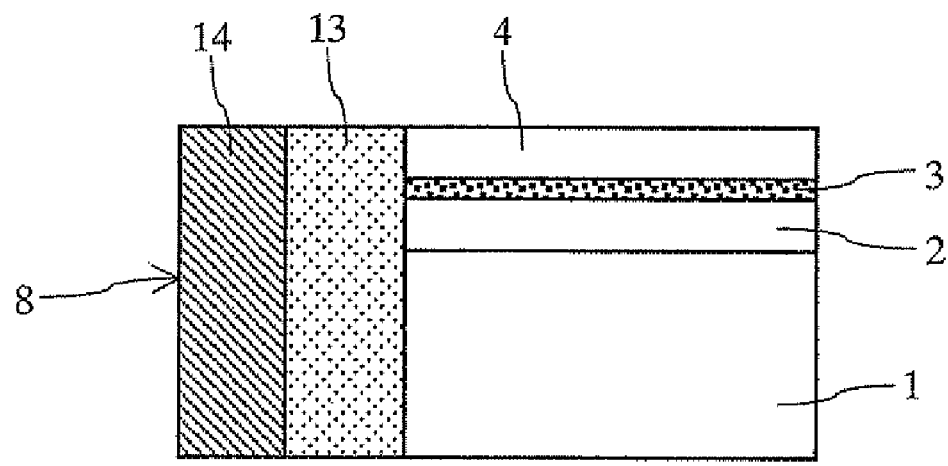
FIG. 4 is an enlarged cross-sectional view of the front end portion of the semiconductor laser device according to a third embodiment of the present invention.

FIG. 4 is a cross-sectional view of the front end portion extending from the front facet 8. As shown in FIG. 4, an anodic oxide film 13 is formed on the front facet 8 to a thickness of $\lambda/2n$ or an integer multiple thereof (where $\lambda$ is the wavelength of the laser beam and n is the refractive index of the dielectric film, or the anodic oxide film). Further, a coating film 14 of alumina (having a refractive index of 1.7) is formed on the anodic oxide film 13 by vapor deposition, sputtering, etc. to a thickness of $\lambda/4n$.

The anodic oxide film 13 functions in the same way as a window formed in the facet portion as described above, thereby preventing a reduction in the COD threshold, as in the first embodiment. Further, since the anodic oxide film 13 has a thickness of $\lambda/2n$, the facet has the same reflectance as that when no thin film is formed on it. This enables the coating film 14 with a thickness of $\lambda/4n$ formed on the anodic oxide film to function as a low reflecting film.

Fourth Embodiment

In the third embodiment, the anodic oxide film 13 having a thickness of $\lambda/2n$ or an integer multiple thereof is formed on the front facet 8, and the coating film 14 having a thickness of $\lambda/4n$ is formed on the anodic oxide film 13. In a fourth embodiment of the present invention, a single-layer or multilayer film is formed by vapor deposition, sputtering, etc. instead of the coating film 14 having a thickness of $\lambda/4n$. This single-layer or multilayer coating film is made of alumina, aluminum nitride, amorphous silicon, aluminum oxide, titanium oxide, niobium oxide, zirconium oxide, tantalum oxide, silicon oxide, or hafnium oxide, etc. The film is formed, for example, by the method disclosed in Japanese patent publication No. JP-A-2004-296903 noted above, to such a thickness that it has a desired reflectance. When the coating film is a multilayer film, the reflectance of the facet does not significantly vary with variations in the thickness of the thin film.

It should be understood that the present invention is not limited to the semiconductor laser devices of the first to fourth embodiments described above, and various alterations may be made thereto without departing from the spirit and scope of the invention.

For example, although in the first to fourth embodiments, the front facet 8 has an anodic oxide film formed thereon, in other embodiments, the rear facet 9 may have an anodic oxide film thereon to prevent a reduction in the COD threshold of the rear facet 9. For example, an anodic oxide film may be formed on the rear facet 9 to a thickness of λ/2n or an integer multiple thereof (where λ is the wavelength of the laser beam and n is the refractive index of the dielectric film, or the anodic oxide film), and a single-layer or multilayer film of alumina or tantalum oxide (a high reflectance film) may be formed on the anodic oxide film by vapor deposition, sputtering, etc. Since the anodic oxide film has a thickness of λ/2n, the facet has substantially the same reflectance as that when no film is formed on it. Therefore, the single-layer or multilayer film formed on the anodic oxide film can be designed in the same manner as in conventional semiconductor lasers.

Further, although in the first to fourth embodiments, the anodic oxide film has a thickness of an odd multiple of λ/4n or an integer multiple of λ/2n (where λ is the wavelength of the laser beam and n is the refractive index of the dielectric film, or the anodic oxide film), in other embodiments, it may have a thickness of 10nm or less. Such a thin anodic oxide film does not affect the reflection characteristics of the facet. Further, a single-layer or multilayer coating film may be formed on the above thin anodic oxide film to provide the facet with a desired reflectance. Such a laser exhibits a smaller reduction in the COD threshold than a laser in which a coating film is directly formed on the facet.

In the first to fourth embodiments, the reflectance of the anodic oxide film on the front facet is determined separately from other thin films for coating. However, the reflectance may be determined by assuming that the anodic oxide film is the first thin layer of a multilayer film. In this case, the anodic oxide film can be designed to have a desired thickness.

Fifth Embodiment

A nitride semiconductor laser device of the present invention is manufactured in the following manner.

First, an n-type AlGaN cladding layer 2, an InGaN multi-quantum well active layer 3, and a p-type AlGaN cladding layer 4 are sequentially formed on a GaN substrate 1 (whose surfaces have been cleaned by thermal cleaning, etc.) by metalorganic chemical vapor deposition (MOCVD).

After completion of the crystal growth of the above layers, the entire surface of the GaN substrate 1 is coated with a resist and this resist is processed into a resist pattern by photolithography. The resist pattern has a shape corresponding to the shape of the mesa portion. Next, the p-type cladding layer 4 is etched, for example, by RIE using the resist pattern as a mask to form a ridge stripe 5 (which will become the optical waveguide).

An $SiO_2$ film having a thickness of 0.2 μm is then formed on the entire surface of the GaN substrate 1 with the above resist pattern (which has been used as the mask) still thereon by CVD, vacuum deposition, sputtering, etc. The resist and the portion of the $SiO_2$ film on the ridge stripe 5 are then removed by lift-off, forming an opening on top of the ridge stripe 5.

Next, a Pt film and an Au film are sequentially formed on the entire surface of the GaN substrate 1, for example, by vacuum deposition. After that, a resist is applied and patterned by photolithography, and then wet or dry etching is performed to form the p-electrode 6 on the top of the ridge stripe 5.

After that, a Ti film and an Au film are sequentially formed on the substrate bottom surface by vacuum deposition, sputtering, etc., thus forming the n-electrode 7. An alloy process is performed to provide ohmic contact to the substrate if necessary.

Next, the GaN substrate 1 is cleaved, etc. into bars, forming the front facet 8 and the rear facet 9. Each bar is then placed on the lower electrode of a plasma anodizing apparatus with its front facet 8 up to anodize that facet.

Figure 5:
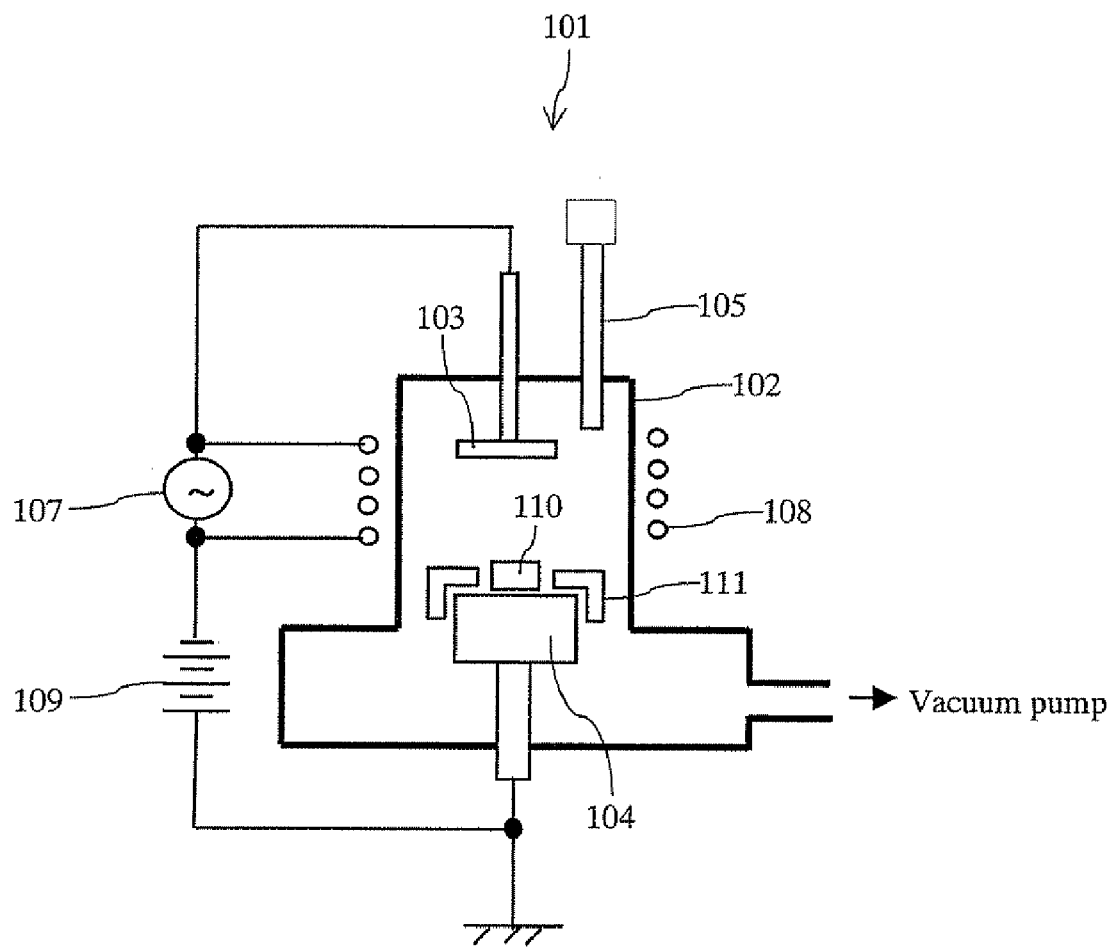
FIG. 5 is a diagram showing a configuration of a plasma anodizing apparatus applicable for manufacturing of the semiconductor laser device according to the embodiments of the present invention.

FIG. 5 is a diagram showing the configuration of a plasma anodizing apparatus 101. Referring to FIG. 5, the plasma anodizing apparatus 101 includes a vacuum chamber 102, an upper electrode 103, a lower electrode 104, a gas feed tube 105, a vacuum pump (not shown), a high frequency power supply 107, a high frequency coil 108, and a DC power supply 109. A plasma anodizing process can form an anodic oxide film to a controlled thickness of a few thousands of angstroms at low temperature (100° C. or less). Furthermore, it does not require a solution, resulting in reduced risk of contamination.

After placing a bar 110 (obtained as described above) on the lower electrode 104, the vacuum chamber 102 is evacuated to a vacuum. Oxygen gas is then introduced through the gas feed tube 105. At that time, the flow and discharge rates of the oxygen gas are adjusted to maintain the oxygen pressure within the vacuum chamber 102 at approximately 0.1 Torr.

After the adjustment of the oxygen pressure, high frequency power is applied to the high frequency coil 108 to excite the oxygen gas into a plasma. The lower electrode 104 can be positioned within the plasma. However, it is usually disposed at a distance from the plasma to avoid damage to the bar 110 from the plasma. The lower electrode 104 can be water-cooled to a constant temperature. Further, those portions of the lower electrode 104 on which the bar 110 is not placed are covered with a quartz cover 111 to prevent oxidation of the lower electrode 104.

After the generation of the plasma, a positive bias (0-100 V) is applied to the lower electrode 104 to oxidize the front facet 8 with active oxygen and thereby form an anodic oxide film. The bias may be applied in a constant current mode to maintain the film-forming speed of the oxide film constant. This allows accurate control of the thickness of the thick oxide film having a thickness of a few hundreds of nanometers. It should be noted that the anodic oxidation method has an advantage over the thermal oxidation method in that it can form a thick film at low temperature.

After anodizing the front facet 8, the bar 110 is retrieved from the chamber and then turned over with its rear facet 9 up and placed on the lower electrode 104 again to anodize the rear facet 9.

It is not necessary to anodize the bars 110 one by one. For example, a few tens of bars 110 may be stacked together and fixed to a jig and then placed in the vacuum chamber 102 to anodize them at a time. Further, instead of oxidizing one facet of the bar face by face, both facets of the bar may be simultaneously oxidized by placing the bar in parallel to the plasma.

After forming the anodic oxide films as described above, a coating film is formed to each facet of the cavity as necessary. The bar is then divided into chips. This completes the manufacture of a gallium nitride semiconductor laser device of the present invention.

It should be noted that the nitride semiconductor laser devices of the present invention can be manufactured by a different method than that described above. For example, before anodizing each facet of the bar, the facet may be exposed to the plasma without applying a voltage to the plasma, in order to clean the facet. In this case, argon may be used as the plasma gas.

Further, after anodizing the facets of the bar 110, the bar 110 may be annealed at 200-600° C. to stabilize the fixed charge within the anodic oxide films and thereby reduce variations in the characteristics of the laser device during operation. Such annealing can be performed within the vacuum chamber 102 if a heating coil is provided around the lower electrode 104. Alternatively, the bar may be retrieved from the vacuum chamber 102 and annealed by a dedicated apparatus.

Further, the anodic oxide films may be formed by using a solution such as KOH instead of using a plasma anodizing apparatus.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2007-058227, filed on Mar. 8, 2007 including specification, claims, drawings and summary, on which the Convention priority of the present application is based, are incorporated herein by reference in its entirety.

The invention claimed is:

1. A gallium nitride semiconductor laser device comprising:
   a substrate, a first cladding layer, an active layer, and a second cladding layer, sequentially arranged, each of said first cladding layer, said active layer, and said second cladding layer including Ga and N as principal constituents, and having opposed first and second facets defining a cavity extending in a propagation direction of a laser beam, said first facet being on a first end of said cavity and through which the laser beam is emitted and second facet being on a second end of said cavity; and
   a Ga-containing anodic oxide film on at least one of said first and second facets, said anodic oxide film being formed by anodizing at least one of said first cladding layer, said active layer, and said second cladding layer at at least one of said first and second facets.

2. The gallium nitride semiconductor laser device as claimed in claim 1, wherein said anodic oxide film has a thickness of $\lambda/4n$, or an odd integer multiple thereof, where $\lambda$ is wavelength of the laser beam and n is refractive index of said anodic oxide film.

3. The gallium nitride semiconductor laser device as claimed in claim 1, wherein said anodic oxide film has a thickness of $\lambda/2n$, or a positive integer multiple thereof, where $\lambda$ is wavelength of the laser beam and n is refractive index of said anodic oxide film.

4. The gallium nitride semiconductor laser device as claimed in claim 1, wherein said anodic oxide film has a thickness of no more than 10 nm.

5. The gallium nitride semiconductor laser device as claimed in claim 1, wherein said anodic oxide film is formed by plasma anodization.

6. The gallium nitride semiconductor laser device as claimed in claim 1, wherein said anodic oxide film is annealed at 200-600° C.

7. A gallium nitride semiconductor laser device comprising:
   a substrate, a first cladding layer, an active layer, and a second cladding layer, sequentially arranged, each of said first cladding layer, said active layer, and said second cladding layer including Ga and N as principal constituents, and having opposed first and second facets defining a cavity extending in a propagation direction of a laser beam, said first facet being on a first end of said cavity and through which the laser beam is emitted and second facet being on a second end of said cavity;
   a Ga-containing anodic oxide film on at least one of said first and second facets, said anodic oxide film being formed by anodizing at least one of said first cladding layer, said active layer, and said second cladding layer at at least one of said first and second facets; and
   a single-layer or multilayer coating film on said anodic oxide film.

8. The gallium nitride semiconductor laser device as claimed in claim 7, wherein said anodic oxide film has a thickness of $\lambda/4n$, or an odd integer multiple thereof, where $\lambda$ is wavelength of the laser beam and n is refractive index of said anodic oxide film.

9. The gallium nitride semiconductor laser device as claimed in claim 7, wherein said anodic oxide film has a thickness of $\lambda/2n$, or a positive integer multiple thereof, where $\lambda$ is wavelength of the laser beam and n is refractive index of said anodic oxide film.

10. The gallium nitride semiconductor laser device as claimed in claim 7, wherein said anodic oxide film has a thickness of no more than 10 nm.

11. The gallium nitride semiconductor laser device as claimed in claim 7, wherein said anodic oxide film is formed by plasma anodization.

12. The gallium nitride semiconductor laser device as claimed in claim 7, wherein said anodic oxide film is annealed at 200-600° C.

* * * * *